United States Patent
Mourant (10) Patent No.: US 11,632,142 B1
(45) Date of Patent: Apr. 18, 2023

(54) HYBRID DIODE SILICON ON INSULATOR FRONT END MODULE AND RELATED METHOD

(71) Applicant: MACOM Technology Solutions Holdings, Inc., Lowell, MA (US)

(72) Inventor: Jean-Marc Mourant, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/521,904

(22) Filed: Nov. 9, 2021

(51) Int. Cl.
  *H04B 1/44* (2006.01)
  *H03F 3/19* (2006.01)

(52) U.S. Cl.
  CPC .............. *H04B 1/44* (2013.01); *H03F 3/19* (2013.01); *H03F 2200/294* (2013.01)

(58) Field of Classification Search
  CPC ........ H04B 1/44; H03F 3/19; H03F 2200/294
  See application file for complete search history.

(56) References Cited

U.S. PATENT DOCUMENTS

| | | | |
|---|---|---|---|
| 6,590,264 B2 | 7/2003 | Ker et al. | |
| 9,111,754 B2 | 8/2015 | Demirlioglu et al. | |
| 9,800,181 B2 | 10/2017 | Jun et al. | |
| 9,917,104 B1 | 3/2018 | Roizin et al. | |
| 10,812,030 B2 | 10/2020 | Ye et al. | |
| 11,152,350 B2 | 10/2021 | Nandakumar | |
| 2021/0135326 A1* | 5/2021 | Puente | H04B 1/48 |
| 2021/0152208 A1* | 5/2021 | Moreschi | H03H 7/255 |

\* cited by examiner

*Primary Examiner* — Nguyen T Vo
(74) *Attorney, Agent, or Firm* — Amin, Turocy & Watson, LLP (57) ABSTRACT

A hybrid diode silicon on insulator front end module and related method are provided. The front end module includes a transmit branch that includes a transmit circuit and a receive branch that includes a receive circuit. The receive circuit includes a low noise amplifier, a pin diode including an anode and a cathode; and a switch. The anode of the pin diode is operatively connected to an antenna switch port and an input voltage source. The cathode of the pin diode is operatively connected to a cathode of the switch. Turning on the switch facilitates a drainage of residual electrical current at the pin diode.

22 Claims, 7 Drawing Sheets

HYBRID DIODE SILICON ON INSULATOR FRONT END MODULE AND RELATED METHOD

TECHNICAL FIELD

The subject disclosure relates generally to electrical circuit design and, in particular, to transmit and/or receive front end modules and methods related thereto.

BACKGROUND

Front End Modules (FEMs) are used in the wireless communications industry and, more specifically, for use in network equipment (e.g., base stations, eNodeBs, and so on). At lower power (e.g., 5 watts (W) to 10 W), cost effective Complementary Metal-Oxide-Semiconductor (CMOS) Silicon on Interface (SOI) switches can be used. At higher power (e.g., more than 20 W) discrete PIN diode designs are used with higher control voltages (e.g., three or more PIN diodes are utilized). The cost for the higher power switch is about double that of the lower power switch. This price increase is due to the complex assembly and the number of discrete components needed for the higher power switch. Accordingly, unique challenges exist related to switches for FEMs.

It is noted that the above-described description is merely intended to provide a contextual overview of FEMs and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In one or more embodiments, a method for selectively controlling a transmit mode and a receive mode of a front end module is provided. The receive portion includes a low noise amplifier, a pin diode, and a switch. The method includes turning off the low noise amplifier such that the low noise amplifier draws no current and facilitating drainage of a residual electrical current from the pin diode. Facilitating the drainage of the residual electrical current can include lowering an input voltage at the pin diode, turning off the pin diode, and turning on the switch. The method also can include switching the front end module from the receive mode to the transmit mode. In some implementations the method can include recycling an electrical current of the low noise amplifier into the pin diode. Further, the receive branch is a limiting branch of the front end module. Additionally, the front end module is configured to operate at a range between around 20 watts to about 40 watts. Turning on the switch facilitates drainage of the residual electrical current from the pin diode. Lowering the input voltage includes switching the input voltage from a first voltage level to a second voltage level, where the second voltage level is a lower voltage level than the first voltage level. For example, the first voltage level is about five volts, and the second voltage level is around zero volts.

In some implementations, the low noise amplifier includes a first transistor and a second transistor. Further to these implementations, turning off the low noise amplifier such that the low noise amplifier draws no current includes switching a gate voltage of the first transistor to a voltage level of zero.

The method can include, according to some implementations, applying the input voltage to the pin diode, turning on the low noise amplifier, turning on the pin diode, turning off the switch, and switching the front end module from the transmit mode to the receive mode. Further to these implementations, applying the input voltage can include switching the input voltage from a first voltage level to a second voltage level, where the first voltage level is a lower voltage level than the second voltage level. In an example, the first voltage level is around zero volt and the second voltage level is about five volts.

In some implementations, the low noise amplifier includes a first transistor and a second transistor. In these implementations, turning on the low noise amplifier includes switching a gate voltage of the first transistor from a voltage level of zero to a voltage level of around five volts.

Another embodiment relates to a front end module that includes a transmit branch that includes a transmit circuit and a receive branch that includes a receive circuit. The front end module also includes an antenna switch port that transitions between a transmit function implemented by the transmit circuit and a receive function implemented by the receive circuit. The receive circuit includes a low noise amplifier, a pin diode including an anode and a cathode; and a switch. The anode of the pin diode is operatively connected to the antenna switch port and an input voltage source. The cathode of the pin diode is operatively connected to a cathode of the switch. Turning on the switch facilitates a drainage of residual electrical current at the pin diode. Further, the receive branch is a limiting branch of the front end module.

An operation of the front end module transitions from the receive mode to the transmit mode based on turning on the switch. Further, turning on the switch is based on the input voltage source switching from a first voltage value to a second voltage value, where the second voltage value is a lower value than the first voltage value. For example, the first voltage value is about five volts, and the second voltage value is around zero volts.

A further embodiment relates to a method for operating a receive portion of a front end module to facilitate switching from a receive mode to a transmit mode. The method includes turning off a low noise amplifier and switching a voltage level applied to an anode of a pin diode from a first voltage level to a second voltage level. The first voltage level is around five volts, and the second voltage level is about zero volts. The method also includes facilitating a drainage of a residual electrical current from the pin diode based on turning on a switch in response to turning off the pin diode. Further, the method includes, based on facilitating the drainage of the residual electrical current, causing the front end module to transition from the receive mode to the transmit mode. The method can also include reusing an electrical current for the low noise amplifier at the pin diode.

DETAILED DESCRIPTION

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

As mentioned, Front End Modules (FEMs) are used in the communications industry for network equipment. FEMs and, more specifically, transmit and/or receive T/R FEMs can provide various functions including, for example, providing a first stage of amplification for signals that are received and a final stage of amplification for signals that are transmitted.

Conventionally, T/R FEMs either provide low power (e.g., 5 W to 10 W) or high power (e.g., more than 20 W). At low power, the FEM can include cost effective Complementary Metal-Oxide-Semiconductor (CMOS) Silicon on Interface (SOI) switches. At high power, discrete PIN diode designs are used with higher control voltages. The cost of the discrete PIN diode design (for the high power) is about double the cost of the CMOS SOI switches (for the low power) due to the complex assembly and the number of discrete components needed in the high power T/R FEMs.

PIN diode products are under margin pressure due to various technology changes. For example, as lower frequency bands become saturated, operators are deploying equipment in new higher frequency bands. Propagation is worse at higher frequency, so massive MIMO (multiple-input and multiple-output) and beam forming are used to achieve the same coverage. Further, the power per transmitter is lower, but more transmitters are needed, at a lower price. Accordingly, the disclosed embodiments provide a low cost switch that can cover the approximately 20 W to 40 W space at a cost that is closer to the cost of the CMOS SOI solution (low power) than the cost of the PIN diode design (high power).

Figure 1:
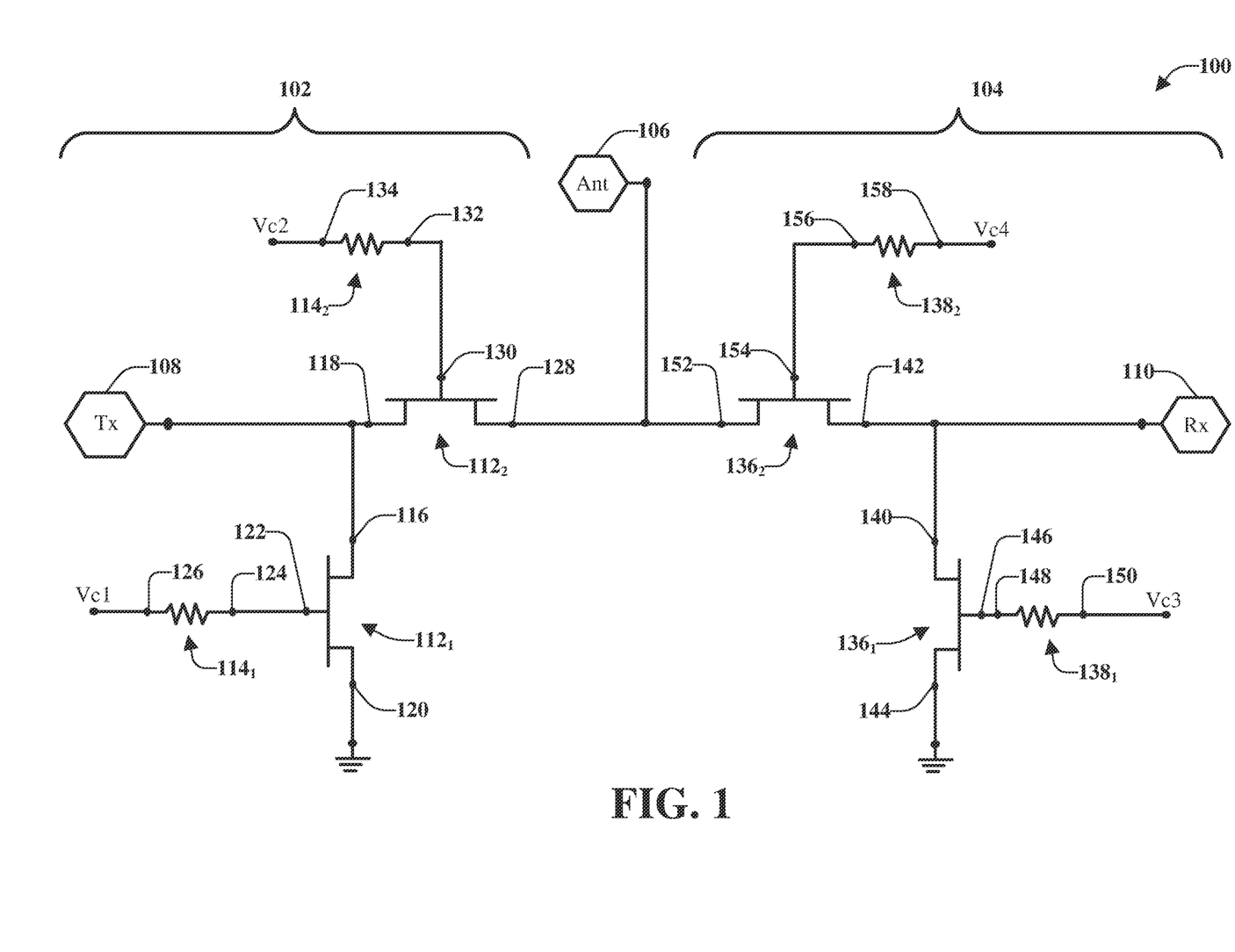
FIG. 1 illustrates a circuit diagram for an example, non-limiting, switch circuit for a front end module.

FIG. 1 illustrates a circuit diagram for an example, non-limiting, switch circuit 100 for a front end module. It is noted that the switch circuit 100 illustrated in FIG. 1 is a simplified circuit, as some components not necessary for understanding the circuit have been omitted for sake of brevity. Further, the switch circuit 100 illustrated is implemented as a SOI CMOS, which is a version of CMOS that is optimized for Radio Frequency (RF) performance. Thus, the switch circuit 100 can be utilized for low power and can be a low-cost design as discussed above.

The switch circuit 100 includes a transmit portion 102 (sometimes referred to as a transmit branch) and a receive portion 104 (sometimes referred to as a receive branch). Thus, the switch circuit is an SOI transmit/receive (T/R) switch circuit. Accordingly, when one or more transmission signals are being transmitted, the transmit portion 102 is activated. Likewise, when one or more reception signals are being received, the receive portion 104 is activated. Only one portion can be active at a time, thus, the switch circuit is either in transmit mode or receive mode (not both modes at a same time).

An antenna port 106 is operatively connected between the transmit portion 102 and the receive portion 104. The antenna port 106 is connected to the respective antennas (e.g., a transmit antenna 108 and a receive antenna 110) via filters and/or other components. The antenna port 106 can facilitate switching of the switch circuit 100 between the transmit portion 102 or the receive portion 104. Accordingly, the one or more transmission signals can be transmitted via the transmit antenna 108 and/or the one or more reception signals can be received via the receive antenna 110.

Such switching is utilized for various implementations, including Time Division Duplex (TDD) systems, Fifth Generation (5G) communication protocols, other communication protocols, and/or more advanced communication protocols. Generally, there are two different implementations utilized with communication networks: Frequency Division Duplex (FDD) and TDD. For a FDD system, the frequency is divided between transmitting and receiving. However, for a TDD system, the same band is utilized, which can be more flexible in terms of software. TDD systems can be utilized for various implementations including beam forming, super MIMO, massive MIMO, and so on. Such systems operate better in TDD, as compared to FDD, because TDD is easier to calibrate.

As mentioned, at any point in time the switch circuit 100 is either transmitting or receiving; but is not doing both at the same time. Thus, a switch (e.g., the switch circuit 100) is utilized to indicate whether the antenna is operating in transmit mode or receive mode.

As illustrated, the switch circuit 100 includes one or more Field-Effect Transistor (FETs) made of a stack of series connected FETs. The number of FETs utilized in the SOI T/R switch circuit (e.g., the switch circuit 100) are as many as are needed to handle the power utilized to operate the switch circuit 100.

In further detail, the transmit portion 102 is illustrated as including two transistors, which can be Field Effect Transistors (FETs). The transistors are labeled as a first FET $112_1$ and a second FET $112_2$. Further, the transmit portion 102 is illustrated as including two resistors, labeled as a first resistor $114_1$ and a second resistor $114_2$.

The transmit antenna 108 is connected to a first terminal 116 of the first FET $112_1$ and a first terminal 118 of the second FET $112_2$. A second terminal 120 of the first FET $112_1$ is connected to ground. Further, a third terminal 122 (e.g., gate terminal) of the first FET $112_1$ is connected to a first side 124 of the first resistor $114_1$. A second side 126 of the first resistor $114_1$ is connected to a first voltage Vc1.

A second terminal 128 of the second FET $112_2$ is connected to the antenna port 106. A third terminal 130 (e.g., gate terminal) of the second FET $112_2$ is connected to a first side 132 of the second resistor $114_2$. A second side 134 of the second resistor $114_2$ is connected to a second voltage VC2.

The receive portion 104 is illustrated as including two transistors, which can be Field Effect Transistors (FETs). The transistors are labeled as a first FET $136_1$ and a second FET $136_2$. Further, the receive portion 104 is illustrated as including two resistors, labeled as a first resistor $138_1$ and a second resistor $138_2$.

The receive antenna 110 is connected to a first terminal 140 of the first FET $136_1$ and a first terminal 142 of the second FET $136_2$. A second terminal 144 of the first FET $136_1$ is connected to ground. Further, a third terminal 146 (e.g., gate terminal) of the first FET $136_1$ is connected to a first side 148 of the first resistor $138_1$. A second side 150 of the first resistor $138_1$ is connected to a third voltage Vc3.

A second terminal 152 of the second FET $136_2$ is connected to the antenna port 106 and to the second terminal 128 of the second FET $112_2$ of the transmit portion 102. A third terminal 154 (e.g., a gate terminal) of the second FET $136_2$ is connected to a first side 156 of the second resistor $138_2$. A second side 158 of the second resistor $138_2$ is connected to a fourth voltage VC4.

By way of example and not limitation, values for the resistors (e.g., the first resistor $114_1$ and the second resistor $114_2$, of the transmit portion 102, and the first resistor $138_1$ and the second resistor $138_2$ of the receive portion 104) of the switch circuit 100 can be around 30,000 ohms. It is noted that these values are for example purposes only and other values of the resistors can be utilized with the switch circuit 100.

Existing SOI switches (e.g., the switch circuit 100) can reach 10 W Long Term Evolution (LTE). However, there are a few limitations with increasing the wattage to, for example, 40 W. One limitation is that the voltage across the series receive branch (e.g., the receive portion 104) is too high and can be, for example, approximately 120 V peak. The FET stack can be increased to around 28 V, but it needs to be ensured that the voltage division is equal, the bias setting is stable at higher power, and the switching time is preserved. The loss is also increased in receive mode, degrading the noise feature (e.g., around 1.6 dB at 3.5 GHz).

Another limitation with the switch circuit 100 is that the SOI process is qualified for a maximum junction temperature of around 125 degrees Celsius. Further, the transmit branch FET area needs to increase to a stack of, for example, twenty FETs, at 6 mm each, to retain a low thermal resistance. The loss is increased, but this is a smaller issue than the receive branch, if the power can be dissipated in the package.

Figure 2:
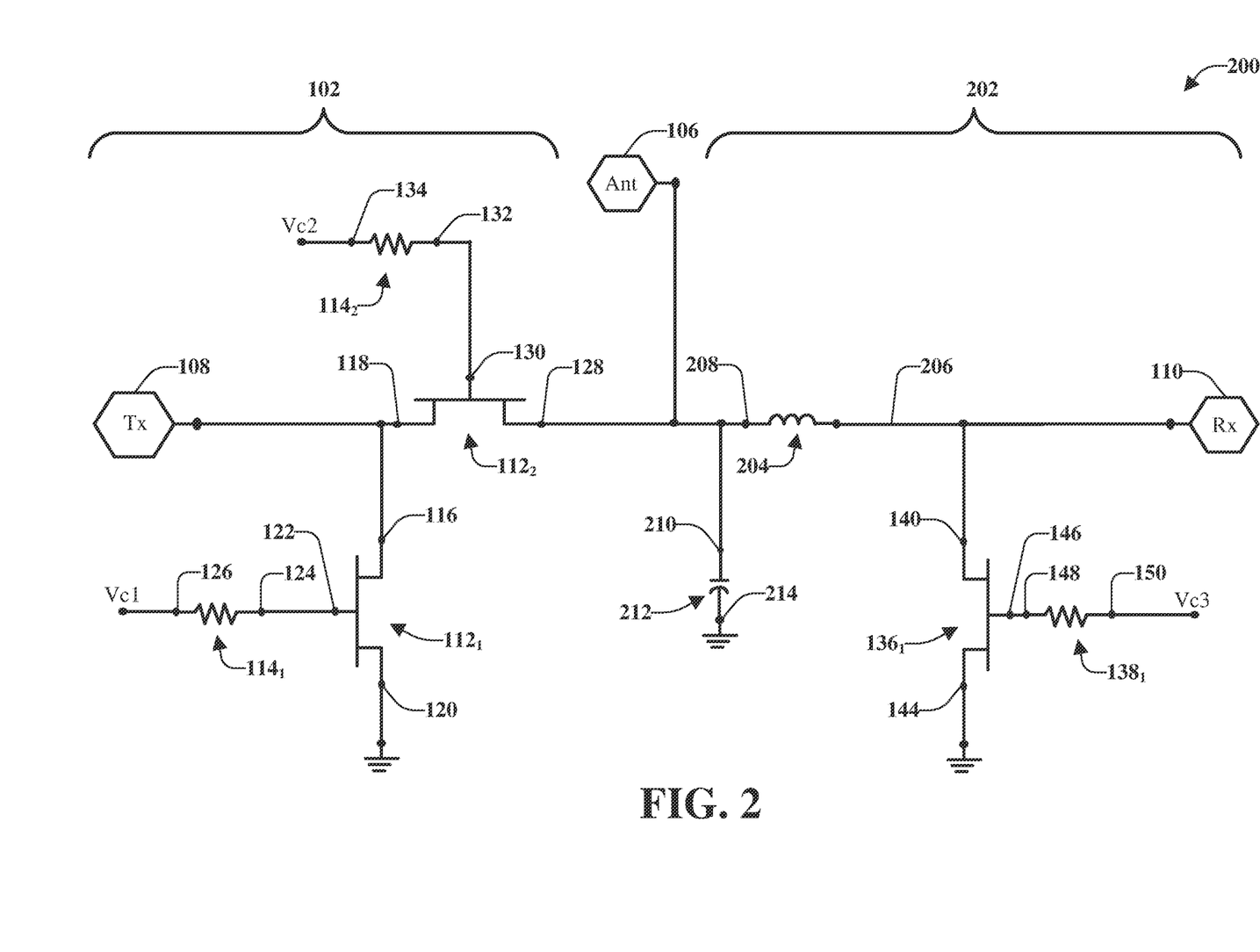
FIG. 2 illustrates an example, non-limiting, switch circuit that utilizes a resonator in the receive branch in order to increase power in a front end module.

Another way to increase power in SOI switches is to trade off bandwidth by replacing the series receive branch with a resonator. FIG. 2 illustrates an example, non-limiting, switch circuit 200 that utilizes a resonator in a receive portion 202 in order to increase power in a front end module. Repetitive description of like elements employed in other embodiments described herein is omitted for sake of brevity. It is noted that the switch circuit 200 illustrated in FIG. 2 is a simplified circuit, as some components not necessary for understanding the circuit have been omitted for sake of brevity.

As illustrated, a portion of the receive portion 202 is replaced with a resonator circuit. In further detail, a resonator 204 is connected, at a first side 206, to the receive antenna 110 and the first terminal 140 of the first FET $136_1$. A second side 208 of the resonator 204 is connected to the antenna port 106 and to a first side 210 of a capacitor 212. A second side 214 of the capacitor 212 is connected to ground. The design of the switch circuit 200 can raise the power to approximately 20 W while limiting the relative bandwidth to around 30%, for example.

It is noted that a PIN diode switch that can work at a 100 W power can also work at lower power. However, the higher costs mentioned above can be an issue. Also, the DC power dissipation for a high power circuit, operating at a lower power in such a manner can also be an issue due to overheating.

Figure 3:
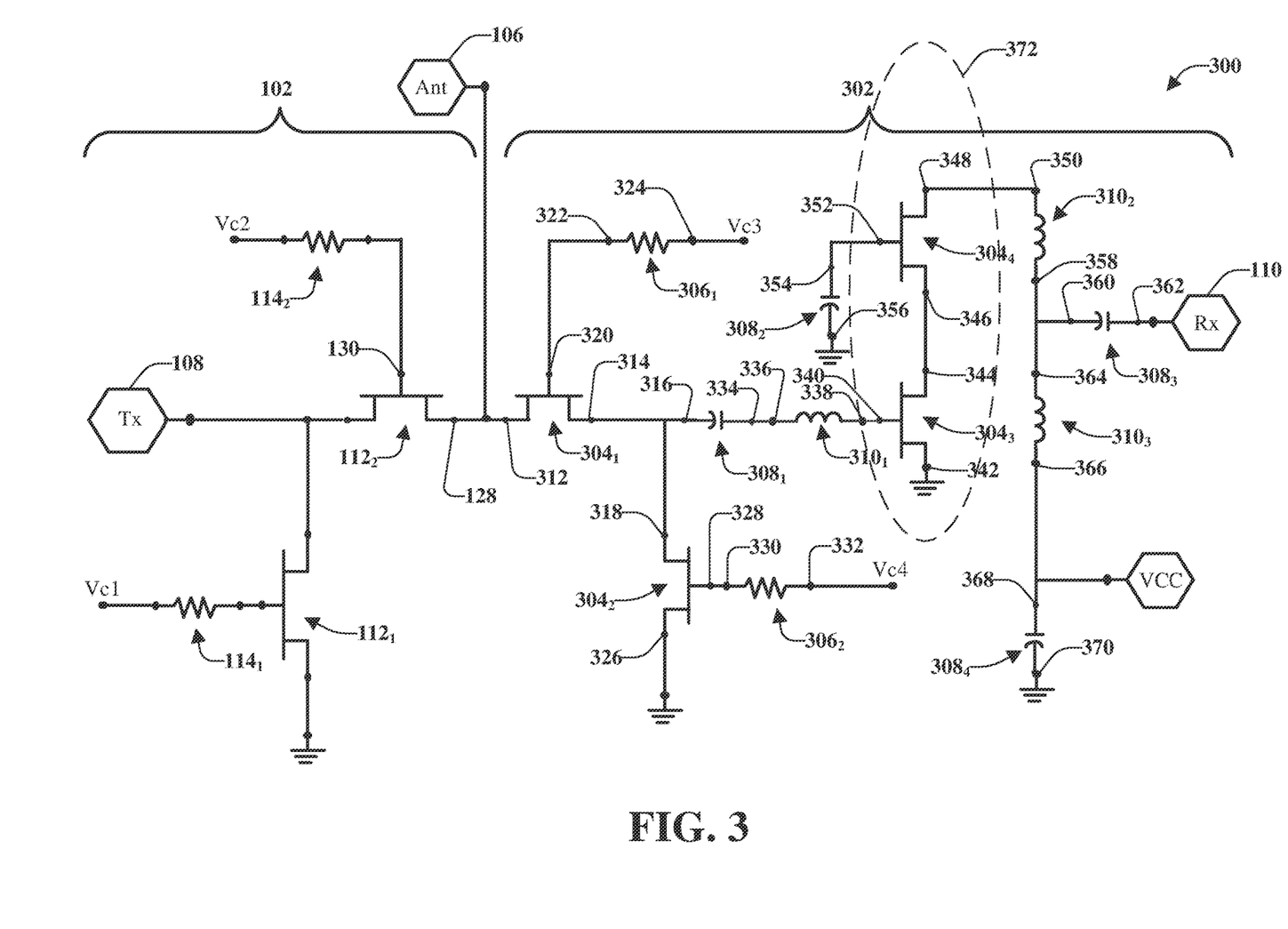
FIG. 3 illustrates an example, non-limiting, front end module circuit with a one stage low noise amplifier for use in a front end module.

FIG. 3 illustrates an example, non-limiting, FEM circuit 300 with a one stage low noise amplifier (LNA) for use in a front end module. Repetitive description of like elements employed in other embodiments described herein is omitted for sake of brevity. It is noted that the FEM circuit 300 illustrated in FIG. 3 is a simplified circuit, as some components not necessary for understanding the circuit have been omitted for sake of brevity.

The transmit portion 102 is the same as the previous figures and will not be described again. As illustrated, the receive branch 302 includes four transistors, which can be FETs. The transistors are labeled as a first FET $304_1$, a second FET $304_2$, a third FET $304_3$, and a fourth FET $304_4$. Further, the receive branch 302 includes two resistors, labeled as a first resistor $306_1$ and a second resistor $306_2$. In addition, the receive branch 302 includes four capacitors, labeled as a first capacitor $308_1$, a second capacitor $308_2$, a third capacitor $308_3$, and a fourth capacitor $308_4$. Also included in the receive branch 302 are three inductors, labeled as a first inductor $310_1$, a second inductor $310_2$, and a third inductor $310_3$.

The antenna port 106 is connected to a first terminal 312 of the first FET $304_1$. A second terminal 314 of the first FET $304_1$ is connected to a first side 316 of the first capacitor $308_1$ and a first terminal 318 of the second FET $304_2$. A third terminal (e.g., a gate terminal 320) of the first FET $304_1$ is connected to a first side 322 of the first resistor $306_1$ and a second side 324 of the first resistor $306_1$ is connected to a third voltage (Vc3).

A second terminal 326 of the second FET $304_2$ is connected to ground. A third terminal (e.g., gate terminal 328) of the second FET $304_2$ is connected to a first side 330 of the second resistor $306_2$. A second side 332 of the second resistor $306_2$ is connected to a fourth voltage (Vc4).

A second side 334 of the first capacitor $308_1$ is connected to a first side 336 of the first inductor $310_1$. A second side 338 of the first inductor $310_1$ is connected to a first terminal (e.g., gate terminal 340) of the third FET $304_3$. A second terminal 342 of the third FET $304_3$ is connected to ground. A third terminal 344 of the third FET $304_3$ is connected to a first terminal 346 of the fourth FET $304_4$. A second terminal 348 of the fourth FET $304_4$ is connected to a first side 350 of the second inductor $310_2$. Further, a third terminal (e.g., gate terminal 352) of the fourth FET $304_4$ is connected to a first side 354 of the second capacitor $308_2$. A second side 356 of the second capacitor $308_2$ is connected to ground.

A second side 358 of the second inductor $310_2$ is connected to a first side 360 of the third capacitor $308_3$. A second side 362 of the third capacitor $308_3$ is connected to the receive antenna 110. The second side 358 of the second capacitor $308_2$ is also connected to a first side 364 of the third inductor $310_3$. A second side 366 of the third inductor $310_3$ is connected to VCC and a first side 368 of the fourth capacitor $308_4$. A second side 370 of the fourth capacitor $308_4$ is connected to ground.

The receive branch 302 includes a switch portion and a low noise amplifier (LNA 372, illustrated within the dotted circle), which is used to amplify the receive signal. The switch can include CMOS NFETs. The LNA 372 can utilize GaAs E FETs (gallium arsenide field-effect transistors) that are normally off. FIG. 3 depicts how the switch can be integrated with the LNA in the receive branch 302. When receiving signals, there is an amplifier because the signals can be quite weak. For example, the signals might be received from a transmitter that is some distance away (e.g., miles). When the receive signal is being amplify there should be as little noise as possible added, thus, the LNA is utilized.

Figure 4:
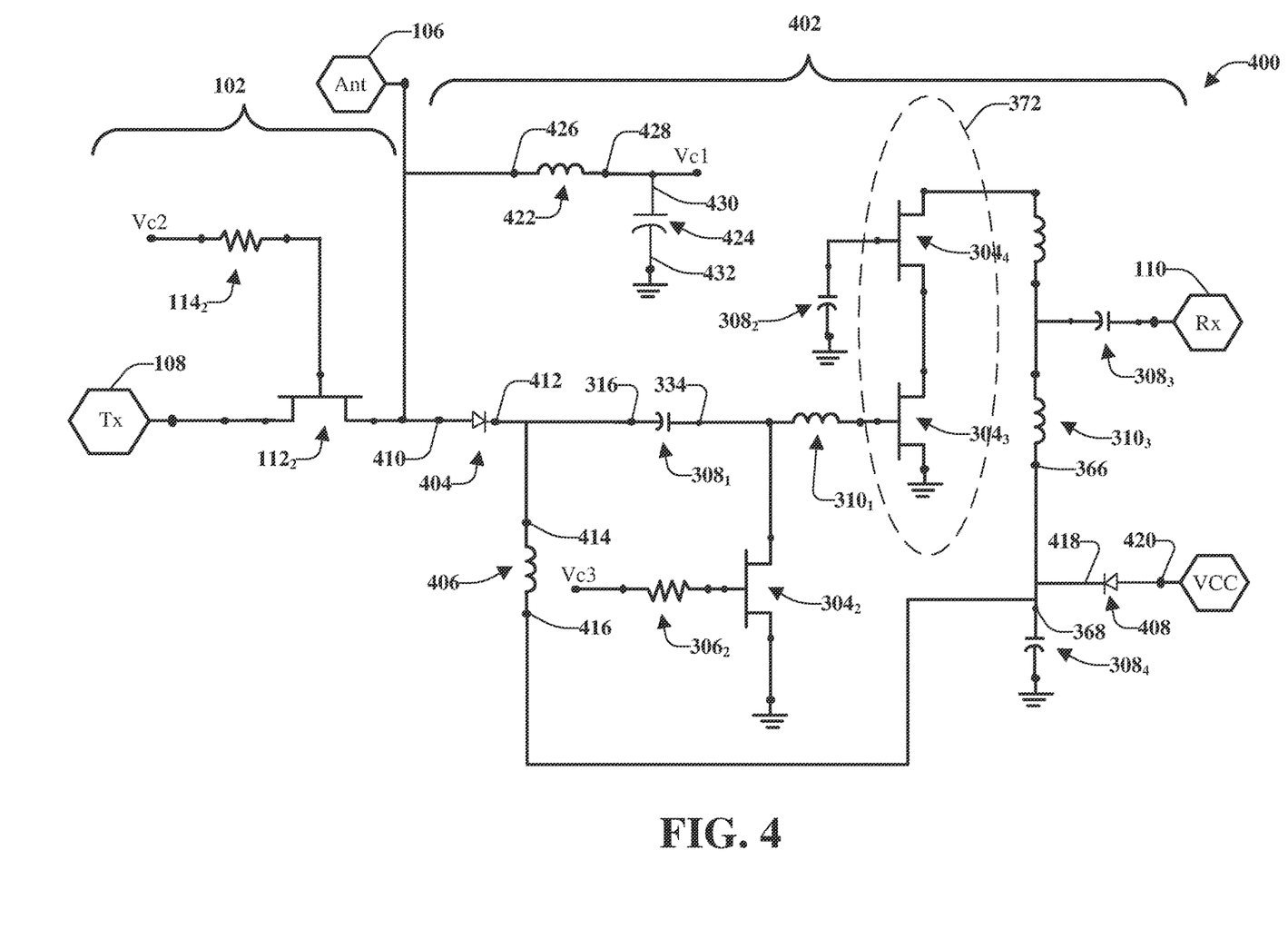
FIG. 4 illustrates an example, non-limiting, circuit diagram for a hybrid diode silicon on insulator front end module according to an embodiment.

FIG. 4 illustrates an example, non-limiting, circuit diagram (FEM circuit 400) for a hybrid diode silicon on insulator front end module according to an embodiment. It is noted that the FEM circuit 400 illustrated in FIG. 4 is a simplified circuit, as some components not necessary for understanding the circuit have been omitted for sake of brevity.

The FEM circuit 400 can operate at a mid-range power (e.g., around 20 W to about 40 W range). Thus, the FEM circuit 400 is a hybrid of the approaches discussed above in terms of cost as well as in terms of power.

The embodiments discussed herein utilize a hybrid approach between the low power circuit (e.g., the switch circuit 100 of FIG. 1) and a high power circuit (e.g., the switch circuit 200 of FIG. 2). This can be achieved with a SOI switch and a single PIN diode mounted on top of the SOI. In accordance with one or more implementations, there is no high voltage utilized with the FEM circuit 400. According to some implementations, the highest voltage is only around 5 V (which is utilized to turn on the LNA 372 and a PIN diode 404 together or at substantially the same time). This allows savings on the external components, in terms of both size and cost. Further, one or more 5V drivers can be integrated in the SOI. Two chokes and one blocking cap are utilized to bias the diode, which can be integrated or external to reduce the receive loss. The transmit shunt can be omitted because, with the disclosed embodiments, the transmit series stack can be large (e.g., around 34) keeping the off capacitance below 50 femtofarad (fF). This helps reduce the receive loss at around 5 GHz. Further, the transmit series stack is easier to implement than the shunt.

In a receive branch 402 of the FEM circuit 400, the receive series FET branch (of FIG. 3) has been replaced with a PIN diode 404. The LNA circuit (e.g., LNA 372) is used but no additional electrical current is consumed. This is based on the electrical current being recycled between the PIN diode 404 and the LNA 372. Further, the bandwidth is not reduced. Additional details will be provided below.

In the implementation of FIG. 4, there is only one PIN diode (e.g., the PIN diode 404) in the receive series path. In contrast, in a high power FEM switch there would be three PIN diodes. Thus, a high power FEM switch is not suitable for mid-range power due to increased components and associated costs, as well as overheating and other issues.

The FEM circuit 400 includes an inductor 406 operatively connected between the PIN diode 404 and switch. Although the switch is illustrated as a Schottky diode 408, the disclosed embodiments are not limited to a Schottky diode and other types of switches can be utilized, including for example, a p-channel field effect transistor (PFET). The PIN diode 404 is biased using 5 V and ground. It is noted that, a higher reverse voltage would be required for handling the power in the off state (e.g., around 20 V). However, in this case, two factors contribute to not having a higher reverse voltage. Specifically, the frequency is higher (massive MIMO is not possible at longer wavelength because antennas get too big) and the power is lower.

The power handling is a function of temperature, frequency, i-region thickness, and reverse voltage. Considering a 100 u i-region, a minimum frequency of 2.3 GHz, and a 5 V reverse voltage, the FEM circuit 400 can handle about 60 W of power (LTE or CW). To obtain a low insertion loss, a high electrical current of 40 mA is used (to make up for the 100 u i-region resistance). Further, the same 40 mA is shared with the GaAs LNA. Thus, there is no DC power penalty in using the PIN diode 404.

In further detail, an anode 410 of the PIN diode 404 is connected to the antenna port 106 and a cathode 412 of the PIN diode 404 is connected to a first side 316 of the first capacitor $308_1$ and a first side 414 of the inductor 406. A second side 416 of the inductor 406 is connected to the first side 368 of the fourth capacitor $308_4$ and the second side 366 of the third inductor $310_3$. Further, the second side 416 of the inductor 406 is connected to an anode 418 of the Schottky diode 408. A cathode 420 of the Schottky diode 408 is connected to VCC.

On the antenna port 106 there is a choke, which includes an inductor 422 and a capacitor 424 connected to a first voltage VC1. The inductor 422 is connected, at a first side 426, to the antenna port 106. A second side 428 of the inductor 422 is connected to a voltage Vc1 and to a first side 430 of the capacitor 424. A second side 432 of the capacitor 424 is connected to ground. Descriptions of the other components of the receive branch 402 are similar to those discussed with respect to FIG. 3 and are not repeated here for purposes of simplicity.

Figure 5:
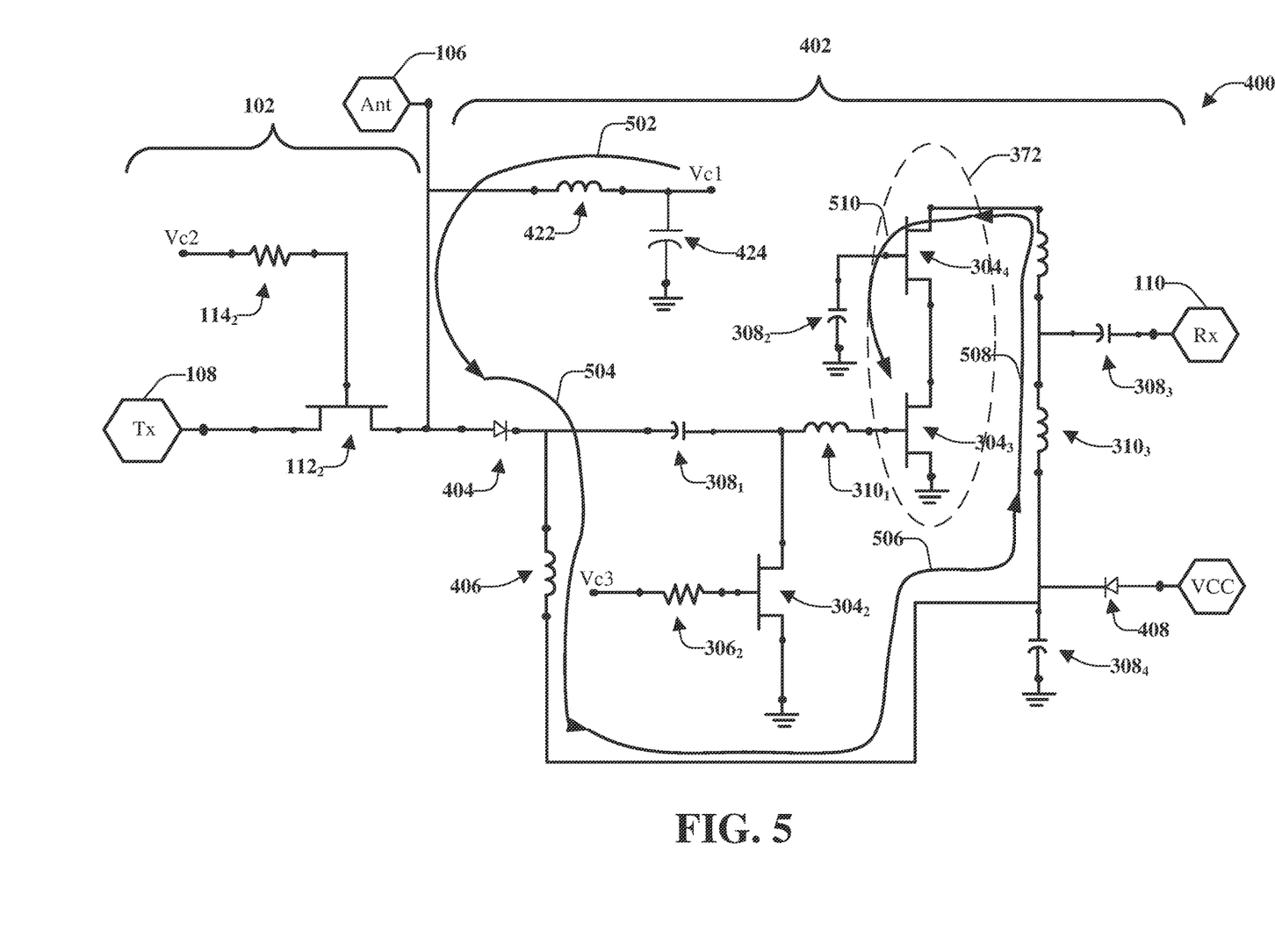
FIG. 5 illustrates an electrical current flow for transitioning from an on-state operation to an off-state operation of a receive portion of the front end module circuit of FIG. 4 according to an embodiment.

FIG. 5 illustrates an electrical current flow for transitioning from an on-state operation to an off-state operation of a receive portion of the front end module circuit of FIG. 4 according to an embodiment. From VC1, the electrical current flows through the inductor 422, as indicated by arrow 502. Then, the electrical current flows into the PIN diode 404 and into the inductor 406, as indicated by arrow 506. The electrical current flows into the inductor 406 since the electrical current is being blocked by the first capacitor $308_1$.

After flowing through the inductor 406, the electrical current flows through the third inductor $310_3$ and the second inductor $310_2$, as indicated by arrow 508. Then the electrical current flows into the LNA 372 (e.g., through the fourth FET $304_4$ and the third FET $304_3$ to ground), as indicated by arrow 510.

The electrical current is recycled by flowing through the PIN diode 404 first and then flowing through (being absorbed by) the LNA 372. Absorbing the electrical current in the LNA facilitates no perceivable electrical current increase because the electrical current is shared between the PIN diode 404 and the LNA 372.

When the FEM circuit 400 is in the off state, there is no electrical current flowing through the PIN diode 404. However, the PIN diode 404 is an electrical current device. Therefore, the electrical current has to not only stop flowing through the PIN diode 404, but the charge accumulated in the PIN diode 404 (e.g., in the i-region) has to drain. Until the electrical current is drained, the PIN diode 404 does not switch (e.g., remains conductive).

In order to drain the PIN diode 404 with minimal delay, the LNA 372 is turned off by using the shunt (e.g., second FET $304_2$). More specifically, the second FET $304_2$ is caused to turn on, which pulls down the gate of the LNA transistor down to zero and the CMOS turns off the third FET $304_3$.

When the third FET $304_3$ is turned off, the electrical current to the PIN diode 404 is turned off (e.g., no more electrical current is flowing through the PIN diode 404).

However, as mentioned above, the PIN diode 404 is still conductive due to electrical current in its i-region (e.g., residual electrical current). Therefore, the PIN diode 404 is still drawing electrical current until the i-region has drained. Accordingly, the Schottky diode 408 is utilized to drain the PIN diode 404.

At about the same time as the LNA is turned off, the VC1 pin is switched from the high voltage (e.g., around +5 voltages in this example) to ground (e.g., zero voltage). Based on the change in voltage, the anode 410 of the PIN diode 404 is pulled to ground and the cathode 412 will follow the anode (at least initially).

Therefore, the Schottky diode 408, which is still at +5 volts, turns on because the PIN diode 404 is now around 0 volts. In an example, the Schottky diode can be a gas Schottky included on the LNA die and can have around a 1.2 or 1.3 voltage barrier and, thus, will turn on because the cathode of the PIN diode goes down to around 0.7 volts, for example. Since the Schottky diode 408 is on, it will drain the residual electrical current from the PIN diode 404. For example, there is a relatively large electrical current flowing through the Schottky diode 408 and that electrical current will neutralize the charge present in the PIN diode 404.

In the absence of the switch (e.g., Schottky diode, PFET, and so on), the switching time would be long. For example, when the LNA is turned off, the anode of the PIN diode 404 is at 0 volts and the cathode of the PIN diode 404 is at 0.7 volts, for example. Thus, the PIN diode 404 is still on and it can take time before there is some leakage or other factor that drains the PIN diode 404. As provided herein, the Schottky diode 408 provides for draining the PIN diode with as little delay as possible.

To turn the PIN diode 404 back on (e.g., when switching back to receive), a reverse operation can be performed. VC1 was zero when the receive branch 402 was off. Therefore, VC1 is switched to +5 V, which turns on the LNA 372 (e.g., the second FET $304_2$ is turned off). It is noted that there is some biasing (not shown) on the LNA 372 (e.g., the third FET $304_3$ will turn back on). As the LNA 372 turns back on, the PIN diode 404 also turns back on using the same electrical current as the electrical current used by the LNA 372.

For a front end module, fast switching between the receive side and the transmit side, or vice versa, should be performed as quickly as possible due to demands placed on a communication system and its associated devices (e.g., user equipment). For example, after receiving one or more signals and it is time to transmit one or more signals, the FEM circuit 400 should quickly switch to transmission (e.g., the transmit portion 102). This is because end users do not want to a delay between when communications (e.g., one or more signals) are received and when communications (e.g., one or more signals) are transmitted.

Methods that can be implemented in accordance with the disclosed subject matter, will be better appreciated with reference to the above flow charts. While, for purposes of simplicity of explanation, the methods are shown and described as a series of acts or blocks, it is to be understood and appreciated that the disclosed aspects are not limited by the number or order of blocks, as some blocks can occur in different orders and/or at substantially the same time with other blocks from what is depicted and described herein. Moreover, not all illustrated blocks can be required to implement the disclosed methods. It is to be appreciated that the functionality associated with the blocks can be implemented by software, hardware, a combination thereof, or any other suitable means (e.g. device, system, process, component, and so forth). Additionally, it should be further appreciated that the disclosed methods are capable of being stored on an article of manufacture to facilitate transporting and transferring such methods to various devices. Those skilled in the art will understand and appreciate that the methods could alternatively be represented as a series of interrelated states or events, such as in a state diagram.

Figure 6:
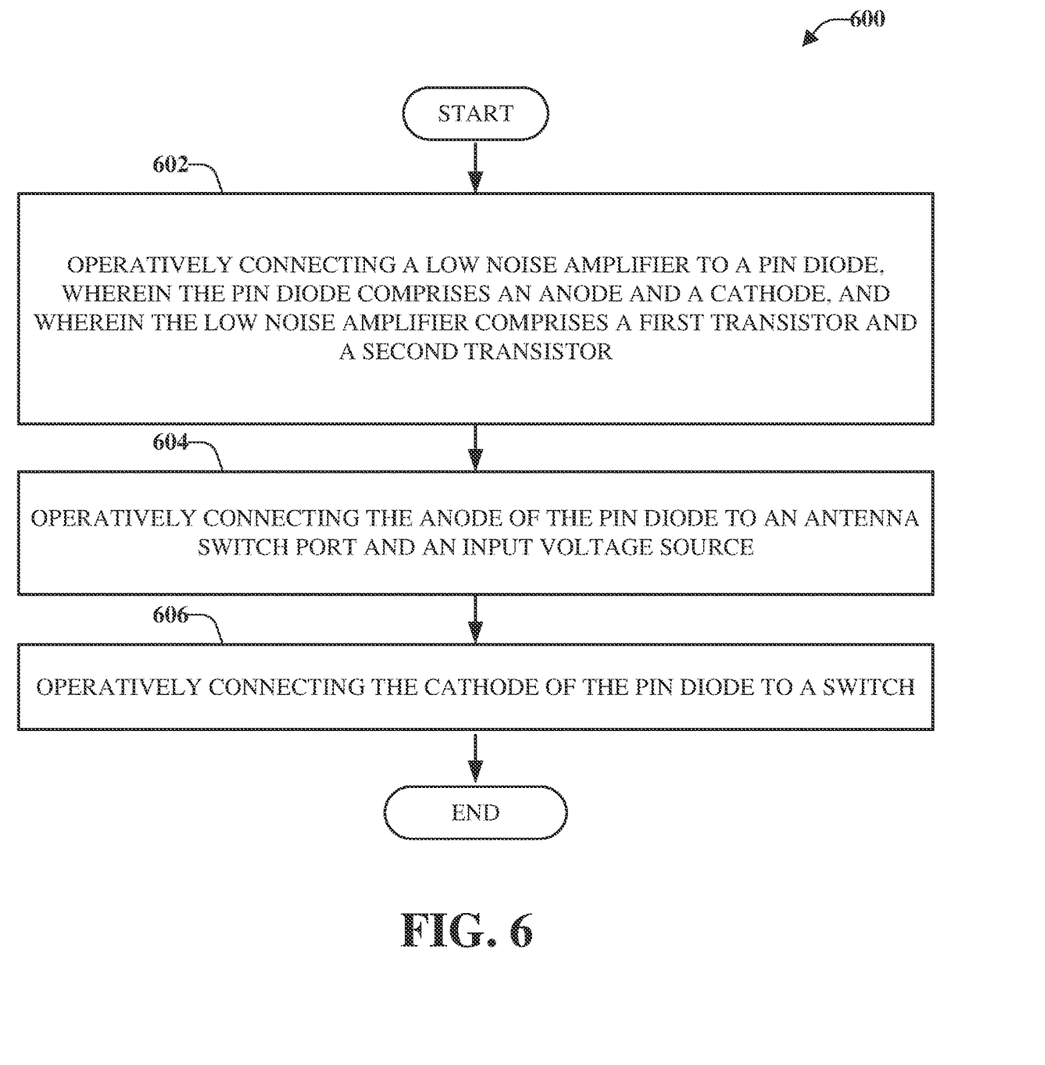
FIG. 6 illustrates an example, non-limiting, method 600 for fabricating a front end module in accordance with one or more embodiments described herein.

FIG. 6 illustrates an example, non-limiting, method 600 for fabricating a front end module in accordance with one or more embodiments described herein. Repetitive description of like elements employed in other embodiments described herein is omitted for sake of brevity.

The method 600 starts at 602 with operatively connecting a low noise amplifier (e.g., the LNA 372) to a pin diode (e.g., the PIN diode 404). The pin diode include an anode (e.g., the anode 410) and a cathode (e.g., the cathode 712). Further, the low noise amplifier includes a first transistor (e.g., the fourth FET $304_4$) and a second transistor (e.g., the third FET $304_3$).

At 604, the anode of the pin diode is operatively connected to an antenna switch port (e.g., the antenna port 106) and an input voltage source (e.g., VC1). Further, at 606, the cathode of the pin diode is operatively connected to a switch (e.g., the Schottky diode 408). The switch facilitates recycling of an electrical current of the low noise amplifier into the pin diode. According to an implementation, the switch is a Schottky diode. In some implementations, the switch is a p-channel field effect transistor.

According to some implementations, the method 600 can include operatively connecting the antenna switch port to a transmit circuit of the front end module. The antenna switch port facilitates a transition between a transmit function implemented by the transmit circuit and a receive function implemented by the receive circuit.

Figure 7:
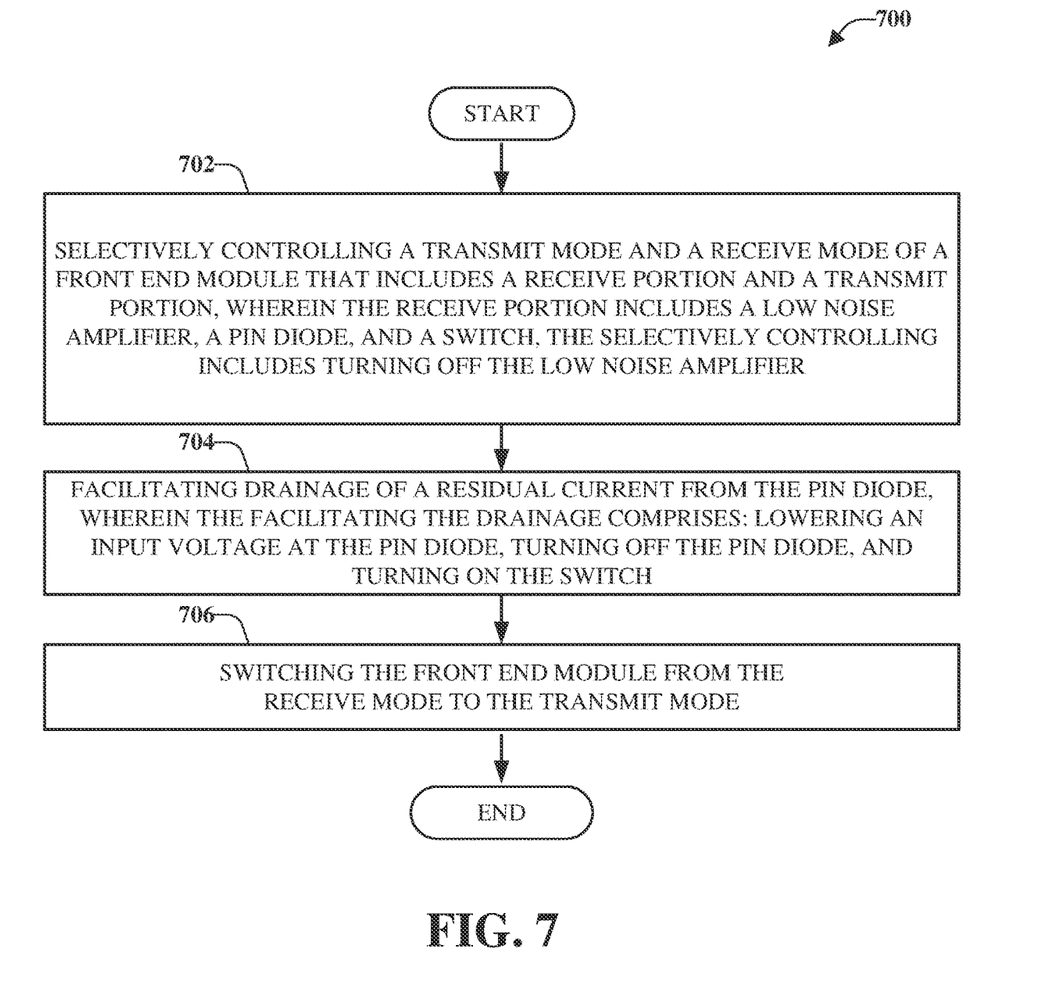
FIG. 7 illustrates an example, non-limiting, computer-implemented method for selectively controlling switching of a front end module between a receive mode and a transmit mode in accordance with one or more embodiments described herein.

FIG. 7 illustrates an example, non-limiting, computer-implemented method 700 for selectively controlling switching of a front end module between a receive mode and a transmit mode in accordance with one or more embodiments described herein. The computer-implemented method 700 can be implemented by a device that includes a front end module (e.g., the FEM circuit 400). Repetitive description of like elements employed in other embodiments described herein is omitted for sake of brevity.

The FEM includes a receive portion (e.g., the receive branch 402) and a transmit portion (e.g., the transmit portion 102). The receive portion includes a low noise amplifier, a pin diode (e.g., the PIN diode 404), and a switch (e.g., the Schottky diode 408). At 702, the low noise amplifier is turned off.

Further, at 704, drainage of a residual electrical current from the pin diode is facilitated. Facilitating the drainage can include lowering an input voltage (e.g., VC1) at an anode of the pin diode. Lowering the input voltage includes switching the input voltage from a first voltage level to a second voltage level. The second voltage level is a lower voltage level than the first voltage level. In an example, the first voltage level is about five volts, and the second voltage level is around zero volts.

Facilitating the drainage can also include turning off the pin diode. For example, the low noise amplifier can include a first transistor and a second transistor. Thus, turning off the low noise amplifier such that the low noise amplifier draws no current can include switching a gate voltage of the first transistor to a voltage level of zero. Facilitating the drainage can also include turning on the switch.

At 706 the front end module is switched from the receive mode to the transmit mode (e.g., via the antenna port 106).

The method can also include recycling an electrical current of the low noise amplifier into the pin diode. The receive branch is a limiting branch of the front end module.

According to some implementations, the method can include switching from the transmit mode to the receive mode, which includes applying the input voltage to the pin diode, turning on the low noise amplifier, turning on the pin diode; turning off the switch, and switching the front end module from the transmit mode to the receive mode. For example, applying the input voltage can include switching the input voltage from a first voltage level to a second voltage level. The first voltage level is a lower voltage level than the second voltage level. The first voltage level can be around zero volts and the second voltage level can be about five volts.

Further, the low noise amplifier includes a first transistor and a second transistor. Thus, turning on the low noise amplifier can include switching a gate voltage of the first transistor from a voltage level of zero to a voltage level of around five volts.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Other than in the operating examples, if any, or where otherwise indicated, all numbers, values and/or expressions referring to parameters, measurements, conditions, etc., used in the specification and claims are to be understood as modified in all instances by the term "about."

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A front end module, comprising:
a transmit branch comprising a transmit circuit;
a receive branch comprising a receive circuit; and
an antenna switch port that transitions between a transmit function implemented by the transmit circuit and a receive function implemented by the receive circuit, wherein the receive circuit comprises:
a low noise amplifier,
a pin diode comprising an anode and a cathode, and
a switch, wherein the low noise amplifier is operatively connected between the pin diode and the switch;
wherein the anode of the pin diode is operatively connected to the antenna switch port and an input voltage source, the cathode of the pin diode is operatively connected to the switch, and wherein an electrical current of the low noise amplifier is configured to be recycled into the pin diode.

2. The front end module of claim 1, wherein the switch facilitates transition of an operation of the front end module from the receive mode to the transmit mode, a turning on of the switch is based on the input voltage source switching from a first voltage value to a second voltage value, the second voltage value is a lower value than the first voltage value.

3. The front end module of claim 1, wherein turning on the switch facilitates a drainage of residual electrical current at the pin diode.

4. The front end module of claim 1, wherein the front end module is configured to operate at a range between around 20 watts to about 40 watts.

5. The front end module of claim 1, wherein the switch is a Schottky diode.

6. The front end module of claim 1, wherein the switch is a p-channel field effect transistor.

7. A method, comprising:
operatively connecting a low noise amplifier to a pin diode, wherein the pin diode comprises an anode and a cathode, and wherein the low noise amplifier comprises a first transistor and a second transistor;
operatively connecting the anode of the pin diode to an antenna switch port and an input voltage source; and
operatively connecting the cathode of the pin diode to a switch,
wherein the switch facilitates recycling of an electrical current of the low noise amplifier into the pin diode.

8. The method of claim 7, further comprising:
operatively connecting the antenna switch port to a transmit circuit, wherein the antenna switch port facilitates a transition between a transmit function implemented by the transmit circuit and a receive function implemented by a receive circuit.

9. The method of claim 7, wherein the switch is a Schottky diode.

10. The method of claim 7, wherein the switch is a p-channel field effect transistor.

11. A method for selectively controlling a transmit mode and a receive mode of a front end module comprising a receive portion and a transmit portion, wherein the receive portion comprises a low noise amplifier, a pin diode, and a switch, wherein the low noise amplifier is operatively connected to the pin diode and the switch, the method comprising:
turning off the low noise amplifier such that the low noise amplifier draws no current;
facilitating drainage of a residual electrical current from the pin diode, wherein the facilitating drainage comprises:
lowering an input voltage at an anode of the pin diode, turning off the pin diode,
turning on the switch; and
switching the front end module from the receive mode to the transmit mode.

12. The method of claim 11, wherein the turning on the switch facilitates drainage of the residual electrical current from the pin diode.

13. The method of claim 11, wherein the lowering the input voltage comprises switching the input voltage from a first voltage level to a second voltage level, the second voltage level is a lower voltage level than the first voltage level.

14. The method of claim 11, wherein the low noise amplifier comprises a first transistor and a second transistor, and the turning off the low noise amplifier comprises switching a gate voltage of the first transistor to a voltage level of zero.

15. The method of claim 11, further comprising:
recycling an electrical current of the low noise amplifier into the pin diode.

16. The method of claim 11, further comprising:
applying the input voltage to the pin diode;
turning on the low noise amplifier;
turning on the pin diode;
turning off the switch; and
switching the front end module from the transmit mode to the receive mode.

17. The method of claim 16, wherein the applying the input voltage comprises:
switching the input voltage from a first voltage level to a second voltage level, the first voltage level is a lower voltage level than the second voltage level.

18. The method of claim 11, wherein the switch is a Schottky diode.

19. The method of claim 11, wherein the switch is a p-channel field effect transistor.

20. The method of claim 11, wherein the front end module is configured to operate at a range between around 20 watts to about 40 watts.

21. A front end module, comprising:
a transmit branch comprising a transmit circuit;
a receive branch comprising a receive circuit; and
an antenna switch port that transitions between a transmit function implemented by the transmit circuit and a receive function implemented by the receive circuit, wherein the receive circuit comprises:
a low noise amplifier,
a pin diode comprising an anode and a cathode, and
a switch, wherein the low noise amplifier is operatively connected between the pin diode and the switch;
wherein the anode of the pin diode is operatively connected to the antenna switch port and an input voltage source, and the cathode of the pin diode is operatively connected to the switch, and
wherein the switch facilitates transition of an operation of the front end module from the receive mode to the transmit mode, a turning on of the switch is based on the input voltage source switching from a first voltage value to a second voltage value, the second voltage value is a lower value than the first voltage value.

22. A front end module, comprising:
a transmit branch comprising a transmit circuit;
a receive branch comprising a receive circuit; and
an antenna switch port that transitions between a transmit function implemented by the transmit circuit and a receive function implemented by the receive circuit, wherein the receive circuit comprises:
a low noise amplifier,
a pin diode comprising an anode and a cathode, and
a switch, wherein the low noise amplifier is operatively connected between the pin diode and the switch;
wherein the anode of the pin diode is operatively connected to the antenna switch port and an input voltage source, and the cathode of the pin diode is operatively connected to the switch, and
wherein turning on the switch facilitates a drainage of residual electrical current at the pin diode.

* * * * *